US012768905B2

(12) United States Patent
Kodo et al.

(10) Patent No.: US 12,768,905 B2
(45) Date of Patent: Oct. 20, 2026

(54) ELECTRIC CIRCUIT SYSTEM, ELECTRIC CIRCUIT SYSTEM CONTROL DEVICE, ELECTRIC CIRCUIT SYSTEM CONTROL METHOD, AND ELECTRIC CIRCUIT SYSTEM CONTROL PROGRAM

(71) Applicant: MITSUBISHI HEAVY INDUSTRIES, LTD., Tokyo (JP)

(72) Inventors: Kimi Kodo, Tokyo (JP); Hiroyuki Ozawa, Tokyo (JP); Kenta Araki, Tokyo (JP); Keijo Hara, Tokyo (JP)

(73) Assignee: MITSUBISHI HEAVY INDUSTRIES, LTD., Tokyo (JP)

( * ) Notice: Subject to any disclaimer, the term of this patent is extended or adjusted under 35 U.S.C. 154(b) by 195 days.

(21) Appl. No.: 18/850,704

(22) PCT Filed: Feb. 13, 2023

(86) PCT No.: PCT/JP2023/004784
§ 371 (c)(1),
(2) Date: Sep. 25, 2024

(87) PCT Pub. No.: WO2023/188877
PCT Pub. Date: Oct. 5, 2023

(65) Prior Publication Data
US 2025/0216477 A1 Jul. 3, 2025

(30) Foreign Application Priority Data
Mar. 30, 2022 (JP) ................................ 2022-056126

(51) Int. Cl.
*G01R 31/52* (2020.01)
*G01R 19/165* (2006.01)

(52) U.S. Cl.
CPC ....... *G01R 31/52* (2020.01); *G01R 19/16576* (2013.01)

(58) Field of Classification Search
CPC ......................... G01R 31/52; G01R 19/16576; H01M 10/425
See application file for complete search history.

(56) References Cited

U.S. PATENT DOCUMENTS

2008/0197832 A1 8/2008 Yokoyama
2022/0190367 A1 6/2022 Matake et al.
(Continued)

FOREIGN PATENT DOCUMENTS

JP 59-70130 * 4/1984
JP S63-166155 A 7/1988
(Continued)

OTHER PUBLICATIONS

International Search Report dated May 9, 2023, issued in counterpart International Application No. PCT/JP2023/004784, with English translation. (5 pages).

*Primary Examiner* — Christopher E Mahoney
(74) *Attorney, Agent, or Firm* — WHDA, LLP

(57) ABSTRACT

An electric circuit system including a plurality of electric paths in which a plurality of potential difference generating units are connected in series, and which have one pole serving as a common electrode, an earth fault detection circuit which is provided between an intermediate potential portion of each electric path and earth, and which is used to detect an earth fault of each electric path, and a control device for detecting an earth fault of each electric path by comparing each measured value measured by the earth fault detection circuit with a threshold for determining an earth fault, wherein the control device comprises a potential difference acquiring unit for acquiring a potential difference of the intermediate potential portions of the plurality of electric paths, and a threshold setting unit for setting the threshold on the basis of the potential differences acquired by the potential difference acquiring unit.

15 Claims, 10 Drawing Sheets

(56) References Cited

U.S. PATENT DOCUMENTS

| | | | | |
|---|---|---|---|---|
| 2023/0253582 | A1 | 8/2023 | Kato et al. | |
| 2024/0339674 | A1* | 10/2024 | Endo | G01R 19/10 |

FOREIGN PATENT DOCUMENTS

| | | | | |
|---|---|---|---|---|
| JP | 2005-348483 | A | | 12/2005 |
| JP | 2006-100005 | A | | 4/2006 |
| JP | 2008206229 | A | * | 9/2008 |
| JP | 2008-293674 | A | | 12/2008 |
| JP | 2011-209247 | A | | 10/2011 |
| JP | 6806824 | B2 | | 1/2021 |
| JP | 6854954 | B1 | | 4/2021 |

* cited by examiner

ELECTRIC CIRCUIT SYSTEM, ELECTRIC CIRCUIT SYSTEM CONTROL DEVICE, ELECTRIC CIRCUIT SYSTEM CONTROL METHOD, AND ELECTRIC CIRCUIT SYSTEM CONTROL PROGRAM

TECHNICAL FIELD

The present disclosure relates to an electric circuit system, an electric circuit system controller, an electric circuit system control method, and an electric circuit system control program.

BACKGROUND ART

In a high-voltage direct current circuit such as a fuel cell system, an intermediate point grounding is performed to reduce a withstand voltage required for the circuit. For example, in a circuit in which a potential difference between a positive electrode and a negative electrode is V, in a case where an intermediate position of the potential is a ground point, the withstand voltage required for the circuit is ½ V.

In addition, the fuel cell system is generally provided with an earth fault detection circuit that detects an electrical leakage, that is, the occurrence of an earth fault, in order to protect a facility and ensure safety. PTL 1 discloses a technique for detecting an intermediate potential of a fuel cell stack in which a plurality of fuel cells are connected in series and for detecting an earth fault. In addition, PTL 2 discloses a technique for grounding an intermediate point of fuel cells connected in series. In addition, PTL 3 discloses a technique for electrically connecting a cell stack connected in series and a heat insulating body to suppress movement of metal ions.

CITATION LIST

Patent Literature

[PTL 1] Japanese Unexamined Patent Application Publication No. 2008-293674
[PTL 2] Japanese Unexamined Patent Application Publication No. 63-166155
[PTL 3] Japanese Patent No. 6854954

SUMMARY OF INVENTION

Technical Problem

However, in the inventions of PTL 1 to PTL 3, there is a possibility that an earth fault will be erroneously detected under a condition where a potential difference occurs between the potentials of the respective ground points in a state where the earth fault detection circuit is connected to two or more ground points, even though the earth fault has not occurred.

The present disclosure has been made in view of such circumstances, and an object thereof is to provide an electric circuit system, an electric circuit system controller, an electric circuit system control method, and an electric circuit system control program capable of suppressing erroneous detection of an earth fault even in a case where a potential difference occurs at each of the ground points.

Solution to Problem

In order to solve the above problems, an electric circuit system, an electric circuit system controller, an electric circuit system control method, and an electric circuit system control program of the present disclosure adopt the following means.

An electric circuit system according to an aspect in some embodiments of the present disclosure includes: a plurality of electric paths in which a plurality of potential difference generating units are connected in series, and one pole serves as a common electrode; an earth fault detection circuit that is provided between an intermediate potential portion of each of the electric paths and an earth, and that is used to detect an earth fault of each of the electric paths; and a controller that detects the earth fault of each of the electric paths in comparison between a measured value measured by each of the earth fault detection circuits and a threshold for determining an earth fault, in which the controller includes a potential difference acquiring unit that acquires a potential difference of the intermediate potential portions of the plurality of electric paths, and a threshold setting unit for setting the threshold on the basis of the potential difference acquired by the potential difference acquiring unit.

An electric circuit system according to an aspect in some embodiments of the present disclosure includes: a plurality of electric paths in which a plurality of potential difference generating units are connected in series, and one pole serves as a common electrode; an earth fault detection circuit that is provided between an intermediate potential portion of each of the electric paths and an earth, and that is used to detect an earth fault of each of the electric paths; and a controller that detects the earth fault of each of the electric paths in comparison between a measured value measured by each of the earth fault detection circuits and a threshold for determining an earth fault, in which the controller includes a potential difference acquiring unit that acquires a potential difference of the intermediate potential portions of the plurality of electric paths, and a current control unit that controls a current flowing through the plurality of electric paths such that the potential difference acquired by the potential difference acquiring unit is set within a predetermined potential difference range.

An electric circuit system controller according to an aspect in some embodiments of the present disclosure being a controller for an electric circuit system including a plurality of electric paths in which a plurality of potential difference generating units are connected in series, and one pole serves as a common electrode, and an earth fault detection circuit that is provided between an intermediate potential portion of each of the electric paths and an earth, and that is used to detect an earth fault of each of the electric paths, in which the controller detects the earth fault of each of the electric paths in comparison between a measured value measured by each of the earth fault detection circuits and a threshold for determining an earth fault, the controller including: a potential difference acquiring unit that acquires a potential difference of the intermediate potential portions of the plurality of electric paths; and a threshold setting unit for setting the threshold on the basis of the potential difference acquired by the potential difference acquiring unit.

An electric circuit system control method according to an aspect in some embodiments of the present disclosure being a control method for an electric circuit system including a plurality of electric paths in which a plurality of potential difference generating units are connected in series, and one pole serves as a common electrode, an earth fault detection circuit that is provided between an intermediate potential portion of each of the electric paths and an earth, and that is used to detect an earth fault of each of the electric paths, and a controller, in which the controller detects the earth fault of each of the electric paths in comparison between a measured value measured by each of the earth fault detection circuits and a threshold for determining an earth fault, the control method including: a potential difference acquisition step of acquiring a potential difference of the intermediate potential portions of the plurality of electric paths; and a threshold setting step of setting the threshold on the basis of the potential difference acquired by the potential difference acquiring step.

An electric circuit system control program according to one aspect in some embodiments of the present disclosure being a control program for an electric circuit system including a plurality of electric paths in which a plurality of potential difference generating units are connected in series, and one pole serves as a common electrode, an earth fault detection circuit that is provided between an intermediate potential portion of each of the electric paths and an earth, and that is used to detect an earth fault of each of the electric paths, and a controller, in which the controller detects the earth fault of each of the electric paths in comparison between a measured value measured by each of the earth fault detection circuits and a threshold for determining an earth fault, the control program executed by the controller, including: a potential difference acquisition step of acquiring a potential difference of the intermediate potential portions of the plurality of electric paths; and a threshold setting step of setting the threshold on the basis of the potential difference acquired by the potential difference acquiring step.

Advantageous Effects of Invention

According to the present disclosure, it is possible to suppress erroneous detection of an earth fault. In addition, the earth fault can be appropriately detected according to an operation state of the electric circuit, and the safety of the electric path can be improved, so that the facility can be protected.

DESCRIPTION OF EMBODIMENTS

Hereinafter, an embodiment of an electric circuit system, an electric circuit system controller, an electric circuit system control method, and an electric circuit system control program according to the present disclosure will be described with reference to the drawings.

Hereinafter, an electric circuit system in some embodiments of the present disclosure will be described with reference to FIG. 1.

Figure 1:
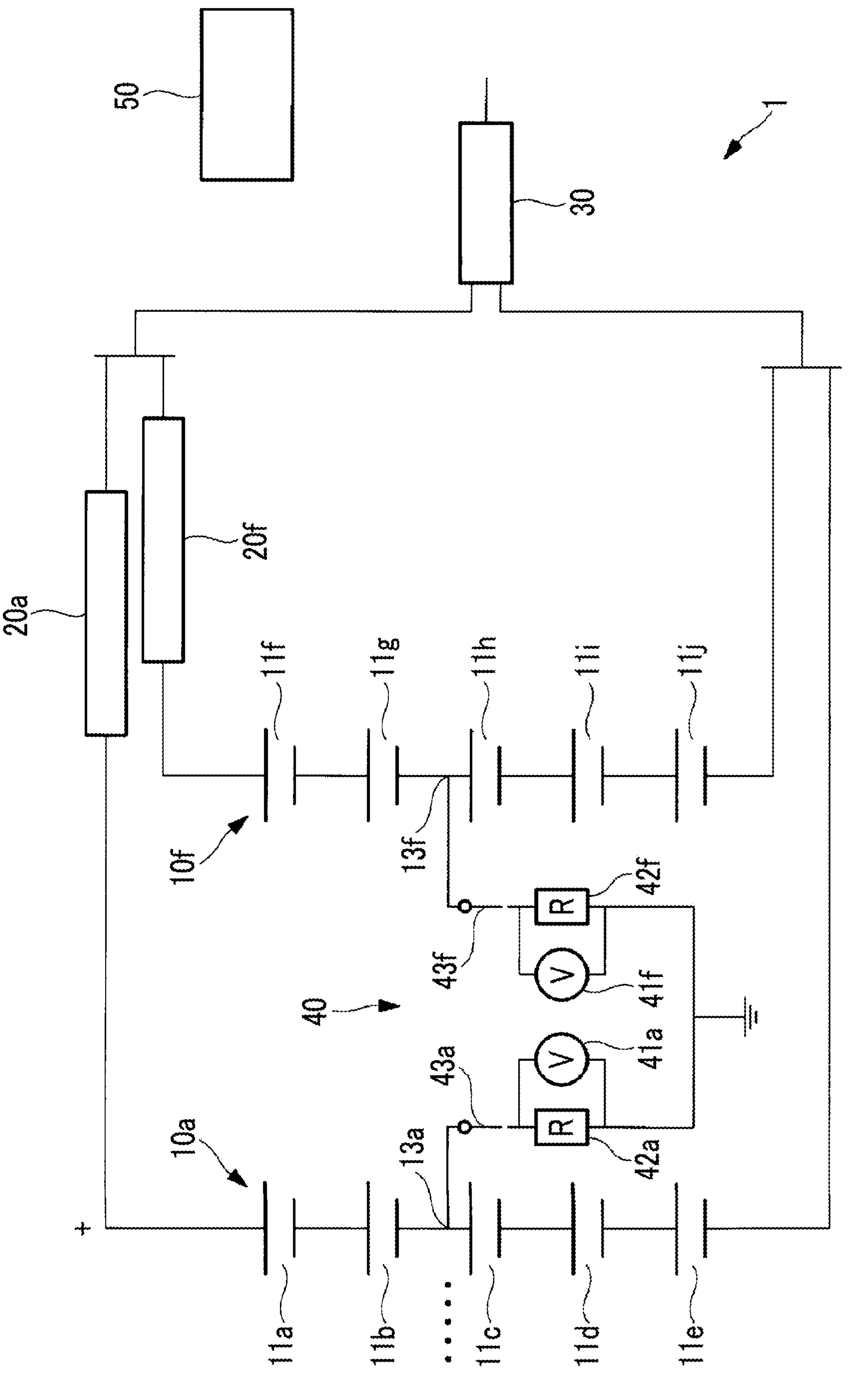
FIG. 1 is a diagram illustrating an electric circuit system in some embodiments of the present disclosure.

As illustrated in FIG. 1, an electric circuit system 1 includes a plurality of fuel cell groups (electric paths, power generation devices) 10 as power generation devices, a plurality of DC-DC converters (voltage converters, DC voltage converters) 20, an inverter 30, an earth fault detection circuit 40, and a controller 50 as main configurations. The plurality of fuel cell groups 10 are, for example, solid oxide fuel cell (SOFC).

The fuel cell group 10 is connected in series to a plurality of fuel cells (potential difference generating units) 11. Further, the fuel cell group 10 is connected in a cascade (multi-stage connection) to configure the electric circuit system 1. In the fuel cell group 10 of the present application, a negative electrode side is a common electrode, and the DC-DC converter 20 is connected to a positive electrode side for each fuel cell group 10. It is possible to optionally determine whether the positive electrode side or the negative electrode side is to be the common electrode.

The inverter 30 is shared by each fuel cell group 10, and a common electrode which is a negative electrode side of the fuel cell group 10 is connected to a negative electrode side of the inverter 30. In addition, the positive electrode side of the inverter 30 is connected to the positive electrode side of each fuel cell group 10 via the DC-DC converter 20. In the electric circuit system 1 of the present disclosure, an example in which two DC-DC converters 20 are provided has been described. However, the number of DC-DC converters 20 only needs to be plural, and the number of the DC-DC converters 20 may be optionally determined in accordance with the number of the fuel cell groups 10.

The earth fault detection circuit 40 is provided between an intermediate point (intermediate potential portion) 13*a* of the fuel cell group 10*a* and the earth, and between an intermediate point (intermediate potential portion) 13*f* of the fuel cell group 10*f* and the earth. The earth fault detection circuit 40 includes a voltage sensor 41, a resistor 42, and a circuit breaker 43, and each voltage sensor 41 measures a voltage across both ends of each resistor 42. The circuit breaker 43*a* and the resistor 42*a* are connected in series in order from the intermediate point 13*a* of the fuel cell group 10*a*, and the circuit breaker 43*f* and the resistor 42*f* are connected in series in order from the intermediate point 13*f* of the fuel cell group 10*f*. In this way, the intermediate potential of each fuel cell group 10 is grounded.

The circuit breaker 43 is normally closed. The circuit breaker 43 is opened when an earth fault occurs in the fuel cell group 10 to which the earth fault detection circuit 40 is connected. At this time, the fuel cell group 10 is tripped (emergency stop).

In FIG. 1, an example in which DC-DC converters 20*a* and 20*f* corresponding to the fuel cell groups 10 one by one are connected to the fuel cell groups 10*a* and 10*f* of two or more in the electric circuit system 1 is illustrated. The number of the fuel cell groups 10 connected in a cascade only needs to be plural, and can be optionally determined. In addition, in the electric circuit system 1 of the present disclosure, an example in which the fuel cell group 10*a* is used for topping (gas flow upstream side) and the fuel cell group 10*f* is used for bottoming (gas flow downstream side) has been described. However, the fuel cell group to be used for topping and the fuel cell group to be used for bottoming can be optionally determined. In addition, an example in which the plurality of fuel cells 11*a*, 11*b*, 11*c*, 11*d*, and 11*e* are connected in series in the fuel cell group 10*a* and an example in which the plurality of fuel cells 11*f*, 11*g*, 11*h*, 11*i*, and 11*j* are connected in series in the fuel cell group 10*f* are illustrated. The number of fuel cells 11 connected in series only needs to be plural and can be optionally determined. The number of fuel cells 11 connected in series in each fuel cell group 10 may be different.

In the following description, when it is necessary to distinguish each fuel cell group 10, each intermediate point 13, each DC-DC converter 20, each voltage sensor 41, each resistor 42, and each circuit breaker 43 from each other, any one of a or f is added to the end, and in a case where it is not necessary to distinguish each fuel cell group 10, each DC-DC converter 20, each voltage sensor 41, each resistor 42, and each circuit breaker 43 from each other, a or f is omitted. In a case where each fuel cell 11 is distinguished, any one of a, b, c, d, e, f, g, h, i, or j is added to the end, and in a case where each fuel cell 11 is not distinguished, a, b, c, d, e, f, g, h, i, or j is omitted.

The controller 50 detects the earth fault of each fuel cell group 10.

Figure 2:
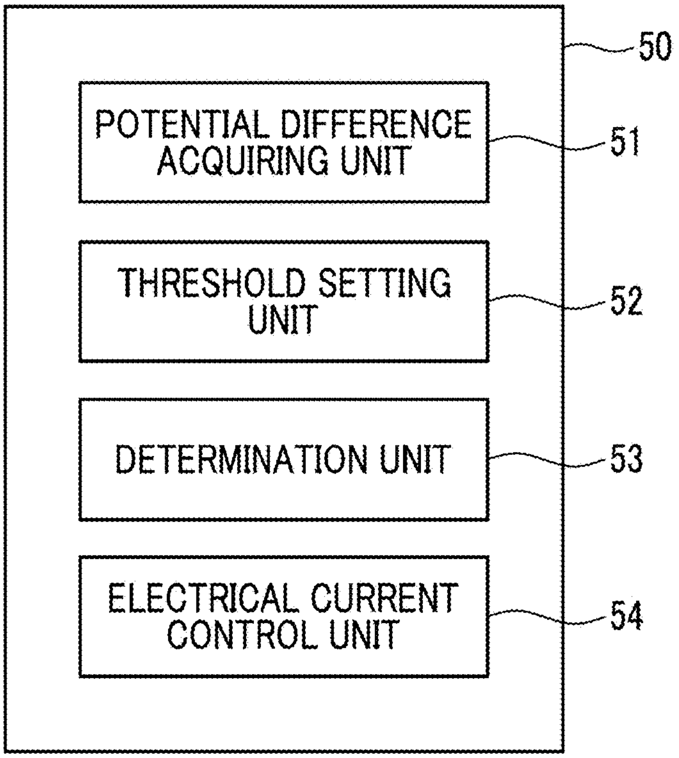
FIG. 2 is a diagram illustrating a controller in some embodiments of the present disclosure.

FIG. 2 is a diagram illustrating a controller according to some embodiments of the present disclosure.

As illustrated in FIG. 2, the controller 50 includes a potential difference acquiring unit 51, a threshold setting unit 52, a determination unit 53, and a current control unit 54.

The potential difference acquiring unit 51 acquires a potential difference of the intermediate point 13 of any two of the fuel cell groups 10. The threshold setting unit 52 sets a threshold used for determining the earth fault according to the state of the potential of the intermediate point 13 of any two of fuel cell groups 10. The determination unit 53 detects a current flowing through the earth fault detection circuit 40 from, for example, the potential difference measured by the voltage sensor 41. The determination unit 53 determines the presence or absence of earth fault occurrence based on the threshold set by the threshold setting unit 52.

Figure 3:
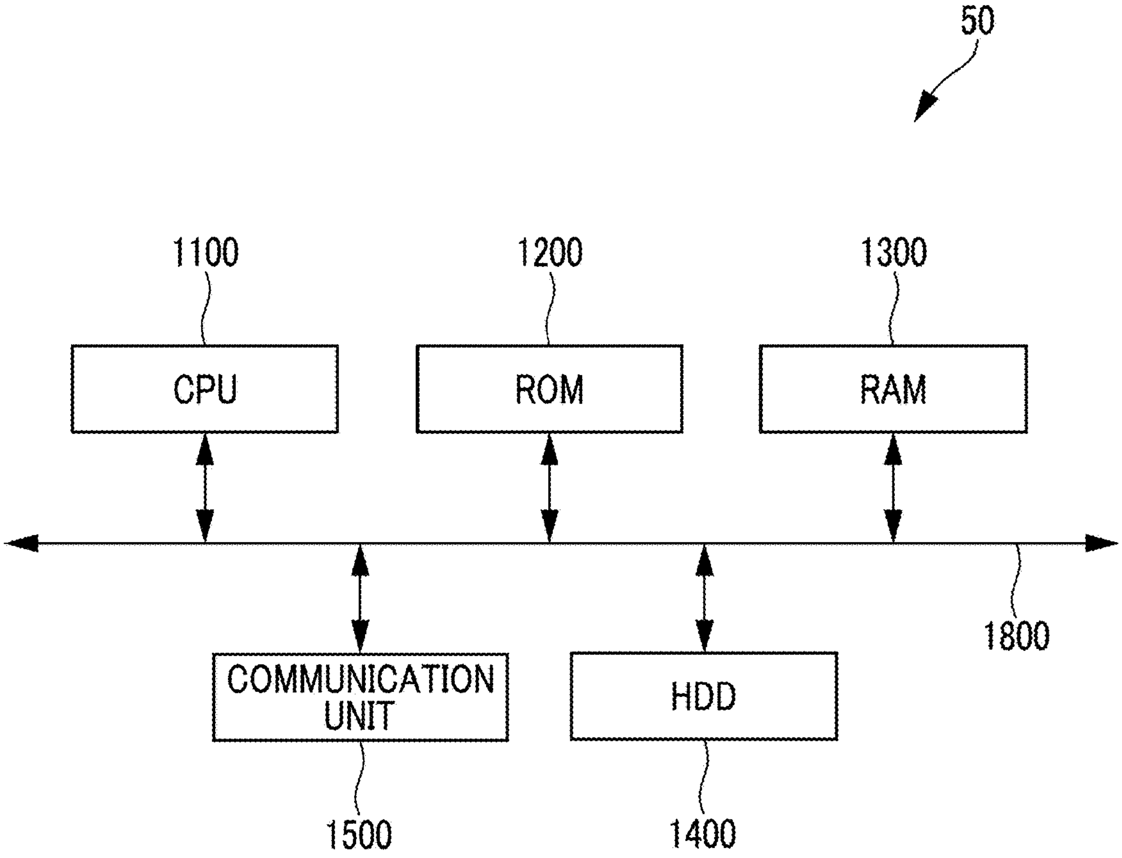
FIG. 3 is a diagram illustrating an example of a hardware configuration of the controller in some embodiments of the present disclosure.

FIG. 3 is a diagram illustrating an example of a hardware configuration of the controller according to some embodiments of the present disclosure.

As illustrated in FIG. 3, the controller 50 is a computer system (computing system), and includes, for example, a central processing unit (CPU: processor) 1100, a secondary storage (read-only memory (ROM), secondary storage: memory) 1200, a main memory (random access memory (RAM), main memory) 1300, a hard disk drive (HDD) 1400 as a large-capacity storage device, and a communication unit 1500 for connecting to a network or the like. Note that a solid-state drive (SSD) may be used as the large-capacity storage device. Each of these units is connected via a bus 1800.

The CPU 1100 performs control of the entire controller 50 by means of an operating system (OS) stored in the secondary storage 1200 connected via the bus 1800, for example, and performs various processing by executing various programs stored in the secondary storage 1200. One or a plurality of the CPUs 1100 may be provided to cooperate with each other to realize the processing.

For example, the main memory 1300 includes a writable memory such as a cache memory or a random access memory (RAM), and is used as a work region for reading an execution program of the CPU 1100 and writing processing data of the execution program.

The secondary storage 1200 is a non-transitory computer readable storage medium. The secondary storage 1200 is, for example, a magnetic disk, a magneto-optical disk, a CD-ROM, a DVD-ROM, a semiconductor memory, or the like. Examples of the secondary storage 1200 include a read-only memory (ROM), a hard disk drive (HDD), a solid-state drive (SSD), and a flash memory. The secondary storage 1200 stores, for example, an OS for controlling the entire information processing device such as Windows (registered trademark), iOS (registered trademark), and Android (registered trademark), a basic input/output system (BIOS), various device drivers for hardware operation of peripheral devices, various types of application software, various data and files, and the like. In addition, the secondary storage 1200 stores a program for realizing various processes and various data required for realizing various processes. A plurality of the secondary storages 1200 may be provided, and the program and the data as described above may be divided and stored in each of the secondary storages 1200.

A series of processes for realizing the functions included in the controller 50 are stored in the secondary storage 1200 or the like in a form of a program as an example, and the CPU (processor) 1100 reads the program in the main memory 1300 to execute information processing and calculation processing, thereby realizing various functions. The program may be installed in the secondary storage 1200 in advance, may be provided in a state of being stored in another non-transitory computer-readable storage medium, or may be distributed via a wired or wireless communication unit. Examples of the non-transitory computer-readable storage medium include a magnetic disk, a magneto-optical disk, a CD-ROM, a DVD-ROM, and a semiconductor memory.

The controller 50 may include an input unit including a keyboard or a mouse, or a display unit including a liquid-crystal display device for displaying data. The controller 50 may include a display unit and a notification unit such as a lamp or a speaker that outputs sound, particularly an alarm sound.

In the fuel cell group 10*a* and the fuel cell group 10*f* of FIG. 1, it is assumed that a case where there is no potential difference between the potential of the intermediate point 13*a*, the potential of the intermediate point 13*f*, and the potential of the earth is a normal operation state. In a normal operation state, no current flows through the earth fault detection circuit 40. Therefore, the measured values of the voltage sensors 41*a* and 41*f* are 0. At this time, the circuit breakers 43*a* and 43*f* are closed.

For example, when it is assumed that an earth fault occurs in the negative electrode of the fuel cell group 10*a*, in a case where the voltage of each fuel cell 11 is 100 V, the voltage of the intermediate point 13*a* of the fuel cell group 10*a* with respect to the ground is 300 V (three times 100 V of the fuel cells 11*c*, 11*d*, and 11*e*). At this time, a current flows from the intermediate point 13*a* of the fuel cell group 10*a* toward the earth in the earth fault detection circuit 40, and the voltage sensor 41*a* detects the potential difference of the resistor 42*a*. The controller 50 determines the detection of the earth fault based on a preset threshold. When the earth fault is detected, the circuit breakers 43*a* and 43*f* are opened, and the fuel cell group 10 is tripped.

It is assumed that the voltages of the respective fuel cells 11*a*, 11*b*, 11*e*, 11*d*, and 11*e* of the fuel cell group 10*a* and the respective fuel cells 11*f*, 11*g*, 11*h*, 11*i*, and 11*j* of the fuel cell group 10*f* are 100 V, respectively. At this time, the potential difference between the negative electrode and the intermediate points 13*a* and 13*f* is 300 V, respectively, and there is no potential difference between the intermediate point 13*a*, the intermediate point 13*f*, and the earth in a normal operation state.

For example, it is assumed that as the operation state of the fuel cell group 10*f* is changed, the load factor (power generation voltage) of the fuel cell group 10*f* is changed, and the voltages of the fuel cells 11*f*, 11*g*, 11*h*, 11*i*, and 11*j* are changed to 80 V, respectively. The potential difference between the negative electrode and the intermediate point 13*f* is 240 V (three times 80 V of the fuel cells 11*h*, 11*i*, and 11*j*), and a potential difference of 60 V is generated between the intermediate point 13*a* and the intermediate point 13*f*. Accordingly, a current flows to the earth fault detection circuit 40 from the intermediate point 13*a* to the intermediate point 13*f*, and the voltage sensors 41*a* and 41*f* detect the potential difference of the resistors 42*a* and 42*f*. In this case, although the earth fault does not occur in the fuel cell groups 10*a* and 10*f*, a potential difference is generated between the intermediate point 13*a* and the intermediate point 13*f*, causing a current to flow through the earth fault detection circuit 40, and there is a possibility that the controller 50 will make a misjudgment that the earth fault is detected.

Therefore, in the first embodiment of the present disclosure, it is assumed that the controller 50 determines the earth fault using the threshold for determining whether the earth fault has been detected, which is set according to the operation state of each fuel cell group 10. As the operation state of each fuel cell group 10, the state of the potential of each intermediate point 13 in each fuel cell group 10 is used.

Next, control by the controller 50 of the present disclosure will be described.

Figure 4:
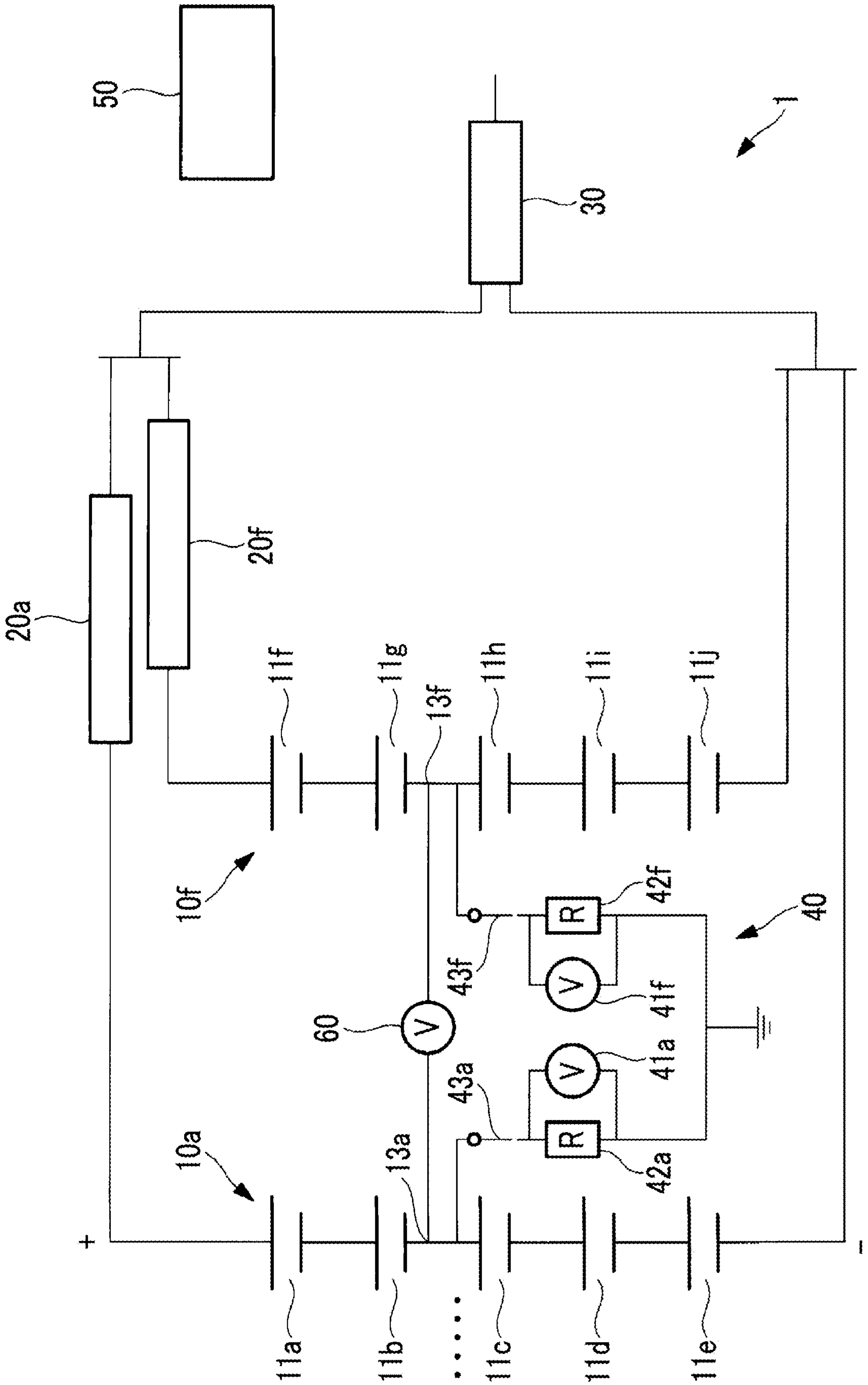
FIG. 4 is a diagram illustrating an electric circuit system in some embodiments of the present disclosure.

FIG. 4 is a diagram illustrating an electric circuit system in some embodiments of the present disclosure.

As illustrated in FIG. 4, the electric circuit system 1 is provided with an intermediate point voltage sensor 60 that measures a potential difference of each intermediate point 13 from a potential of an intermediate point 13*a* of the fuel cell group 10*a* and a potential of an intermediate point 13*f* of the fuel cell group 10*f*. The potential difference acquiring unit 51 acquires the potential difference (voltage) measured by the intermediate point voltage sensor 60.

In the present embodiment, the threshold setting unit 52 sets the threshold for determination as the earth fault, based on the potential difference measured by the intermediate point voltage sensor 60. For example, when the potential difference measured by the intermediate point voltage sensor 60 is 60 V, the threshold is set such that the current flowing through the earth fault detection circuit 40 is not determined as the earth fault until the current flows at the potential difference of 60 V or until the current flows at a value obtained by adding a predetermined value to the potential difference of 60 V.

Accordingly, the determination unit 53 compares the voltage value detected by each of the voltage sensors 41*a* and 41*f* with the threshold set by the threshold setting unit 52, and determines that the earth fault is present in a case where the voltage value detected by the voltage sensor 41*a* or 41*f* corresponding to the current flowing through the earth fault detection circuit 40 exceeds the threshold.

Modification Example 1

Figure 5:
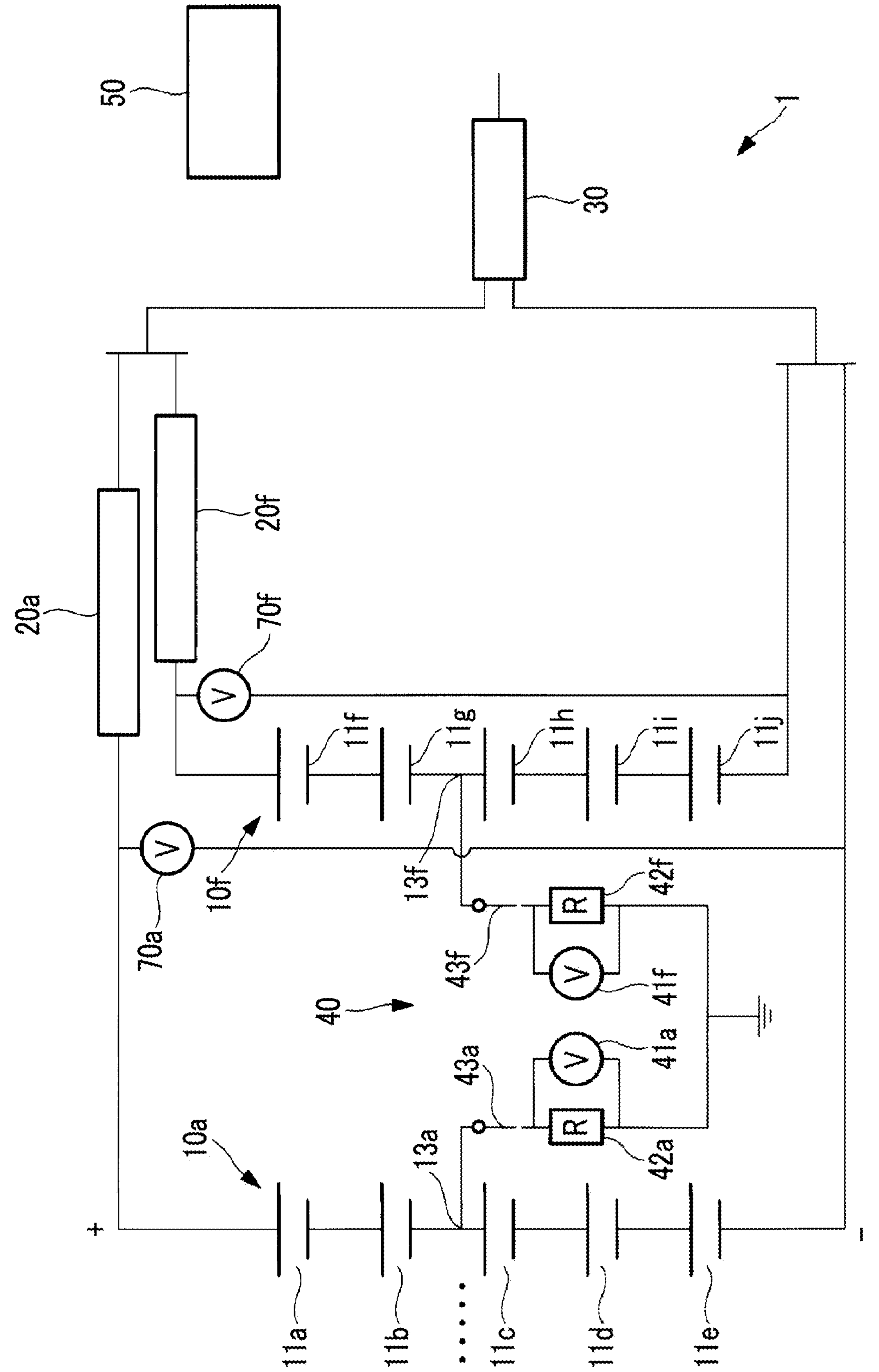
FIG. 5 is a diagram illustrating an electric circuit system of modification example 1 in some embodiments of the present disclosure.

FIG. 5 is a diagram illustrating an electric circuit system of modification example 1 in some embodiments of the present disclosure.

As illustrated in FIG. 5, the electric circuit system 1 is provided with a DC-DC converter voltage sensor 70*a* that measures the input voltage of the DC-DC converter 20*a* (potential difference between the negative electrode and the positive electrode of the fuel cell group 10*a*) and a DC-DC converter voltage sensor 70*f* that measures the input voltage of the DC-DC converter 20*f* (potential difference between the negative electrode and the positive electrode of the fuel cell group 10*f*), the DC-DC converter voltage sensor 70*a* and the DC-DC converter voltage sensor 70*f* being provided on the input side of the DC-DC converter 20, respectively. The potential difference acquiring unit 51 acquires the voltage measured by the DC-DC converter voltage sensor 70*a* and the voltage measured by the DC-DC converter voltage sensor 70*f*.

The potential difference acquiring unit 51 estimates the potential difference between the intermediate point 13*a* and the intermediate point 13*f* from the input voltage of the DC-DC converter 20*a* measured by the DC-DC converter voltage sensor 70*a* and the input voltage of the DC-DC converter 20*f* measured by the DC-DC converter voltage sensor 70*f*. For example, in a case where the measured value of the DC-DC converter voltage sensor 70*a* is 500 V and the measured value of the DC-DC converter voltage sensor 70*f* is 400 V, the controller 50 estimates that the voltage of each of the fuel cells 11*a*, 11*b*, 11*c*, 11*d*, and 11*e* is 100 V, that the voltage of each of the fuel cells 11*f*, 11*g*, 11*h*, 11*i*, and 11*j* is 80 V, and that the potential difference between the intermediate point 13*a* and the intermediate point 13*f* is 60 V. The threshold setting unit 52 sets the threshold such that the current flowing through the earth fault detection circuit 40 is not determined as the earth fault until the current flows at the potential difference 60 V or at a value obtained by adding a predetermined value to the potential difference 60 V, on the basis of the estimated potential difference 60 V.

In this manner, the determination unit 53 uses a threshold set by the threshold setting unit 52 based on the voltage value detected by each of the voltage sensors 41*a* and 41*f*, to determine that the earth fault is present in a case where the voltage value detected by the voltage sensor 41*a* or 41*f* corresponding to the current flowing in the earth fault detection circuit 40 exceeds the threshold value.

Modification Example 2

Figure 6:
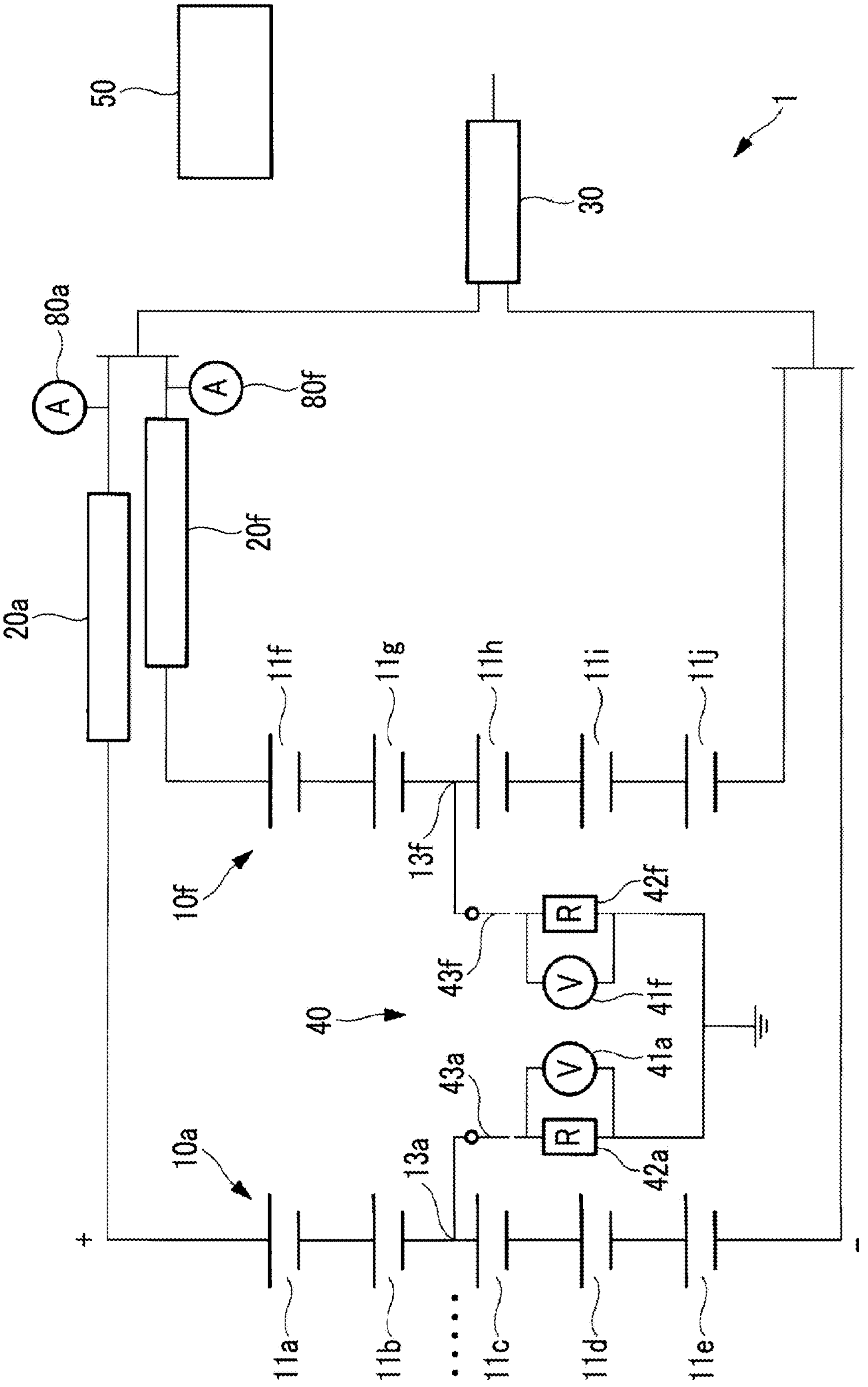
FIG. 6 is a diagram illustrating an electric circuit system of modification example 2 in some embodiments of the present disclosure.

FIG. 6 is a diagram illustrating an electric circuit system of modification example 2 in some embodiments of the present disclosure.

As illustrated in FIG. 6, the electric circuit system 1 is provided with a current sensor 80*a* that measures a current of the fuel cell group 10*a* and a current sensor 80*f* that measures a current of the fuel cell group 10*f*.

The potential difference acquiring unit 51 calculates the power generation voltage of each fuel cell 11 from the current of the fuel cell group 10*a* measured by the current sensor 80*a* and the current of the fuel cell group 10*f* measured by the current sensor 80*f*, and estimates the potential difference between the intermediate point 13*a* and the intermediate point 13*f*. For example, the potential difference acquiring unit 51 calculates that the power generation voltages of the fuel cells 11*a*, 11*b*, 11*c*, 11*d*, and 11*e* are 100 V, respectively, and that the power generation voltages of the fuel cells 11*f*, 11*g*, 11*h*, 11*i*, and 11*j* are 80 V, respectively, and estimates that the potential difference between the intermediate point 13*a* and the intermediate point 13*f* is 60 V. The threshold setting unit 52 sets a threshold for determination as the earth fault, based on the estimated potential difference. In a case where the estimated potential difference is 60 V, a threshold is set such that the current flowing through the earth fault detection circuit 40 is not determined as the earth fault until the current flows at the potential difference of 60 V or at a value obtained by adding a predetermined value to the potential difference of 60 V.

Accordingly, the determination unit 53 determines that the earth fault is present in a case where the voltage value detected by the voltage sensor 41*a* or 41*f* corresponding to the current flowing through the earth fault detection circuit 40 exceeds the threshold set by the threshold setting unit 52 based on the voltage value detected by each of the current sensors 80*a* and 80*f*.

Figure 7:
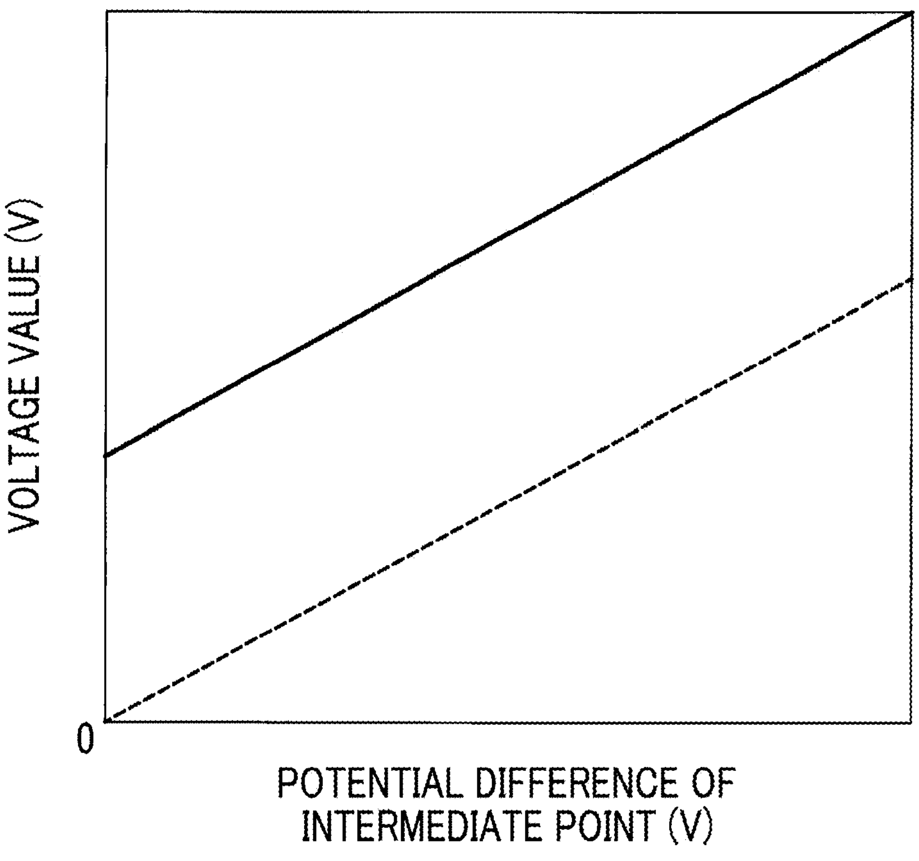
FIG. 7 is a diagram illustrating a relationship between a potential difference and a threshold of an intermediate point in some embodiments of the present disclosure.

FIG. 7 is a diagram illustrating a relationship between a potential difference between the intermediate points and a threshold in some embodiments of the present disclosure.

In FIG. 7, a vertical axis is the voltage value (potential difference of the resistor 42) measured by the voltage sensor 41 of the earth fault detection circuit 40, and a horizontal axis is the potential difference of each fuel cell group 10 (for example, the intermediate points 13*a* and 13*f*). In addition, a broken line indicates a voltage value (a voltage value measured by the voltage sensor 41) corresponding to a current flowing to the earth fault detection circuit 40 due to a potential difference between the intermediate points 13*a* and 13*f*, and a solid line indicates a predetermined threshold set by the controller 50 according to the potential difference between the intermediate points 13*a* and 13*f*.

As illustrated in FIG. 7, the predetermined threshold is a value obtained by adding a value (tolerance) of the voltage value (a voltage value measured by the voltage sensor 41) corresponding to the current value flowing through the earth fault detection circuit 40, which changes according to the potential difference between the intermediate points 13*a* and 13*f*, to the earth fault determination value in a case where there is no potential difference between the intermediate points 13*a* and 13*f*.

In the above embodiment, a case where a predetermined threshold is set according to the potential state has been described. However, in the present embodiment, a case where control is performed such that a potential difference does not occur in each intermediate point (intermediate potential portion) will be described. Hereinafter, the controller 50 according to the present embodiment will be mainly described with respect to points different from the above-described embodiment.

The current control unit 54 (refer to FIG. 2) of the controller 50 controls the current flowing through each fuel cell group 10 such that the potential difference acquired by the potential difference acquiring unit 51 is set within a predetermined potential difference range.

Figure 8:
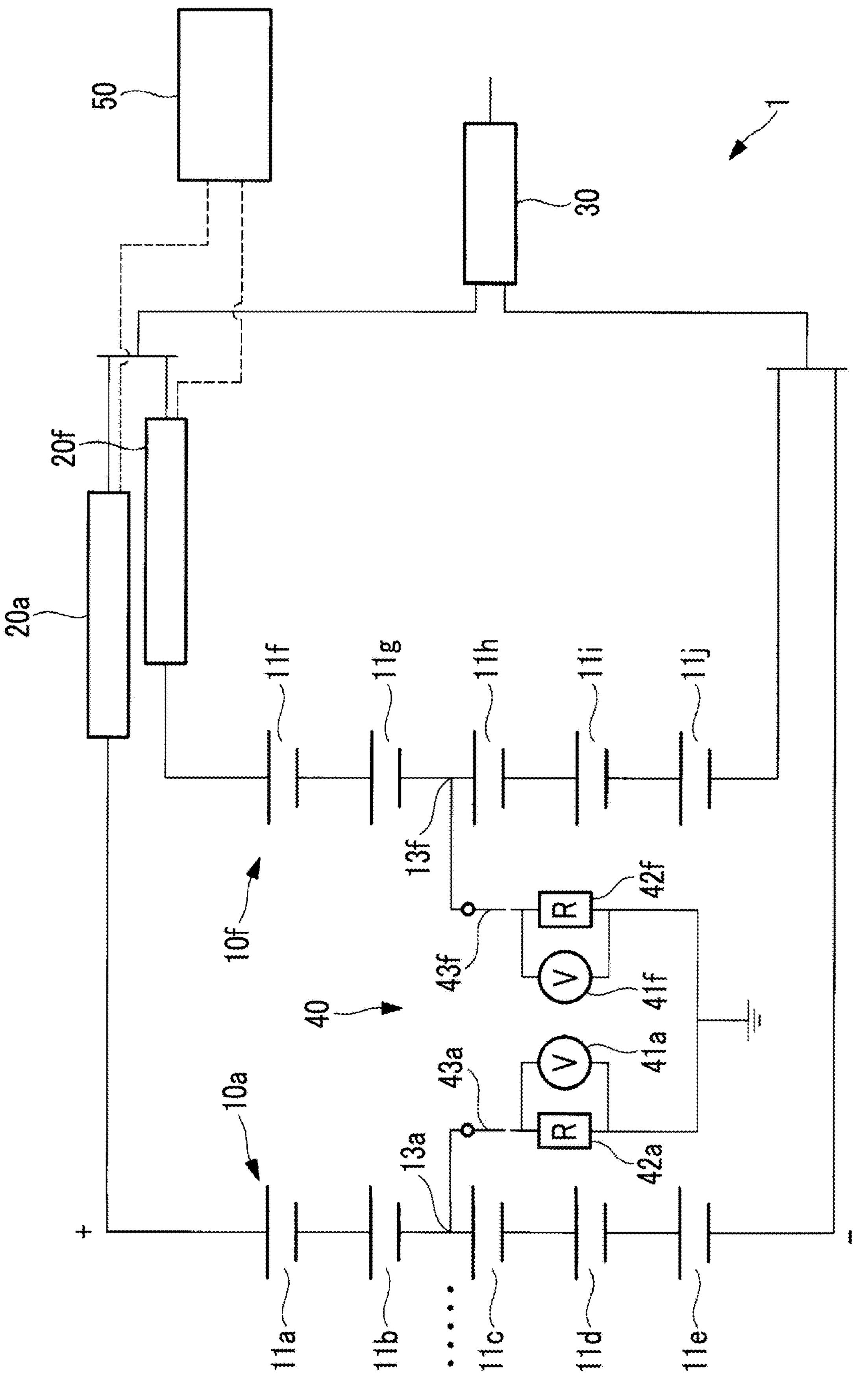
FIG. 8 is a diagram illustrating an electric circuit system in some embodiments of the present disclosure.

FIG. 8 is a diagram illustrating an electric circuit system in some embodiments of the present disclosure.

In FIG. 8, performing control of each fuel cell group 10 by the current control unit 54 of the controller 50 is shown by a broken line. The controller 50 is connected to each of the DC-DC converters 20*a* and 20*f*.

In the present embodiment, the controller 50 performs control such that a potential difference is generated between the intermediate point 13*a* of the fuel cell group 10*a* and the intermediate point 13*f* of the fuel cell group 10*f*, and the earth fault detection circuit 40 does not erroneously detect the earth fault.

The current control unit 54 controls the currents of the fuel cell group 10*a* and the fuel cell group 10*f* such that a potential difference does not occur between the intermediate point 13*a* and the intermediate point 13*f*. Specifically, the current control unit 54 controls the currents of each of the DC-DC converters 20*a* and 20*f*, that is, controls the loads. In this case, the current control unit 54 defines in advance a range of the potential difference that is allowable when the potential difference is a value within the range of the potential difference that is allowable, not only when the potential difference is 0.

Figure 9:
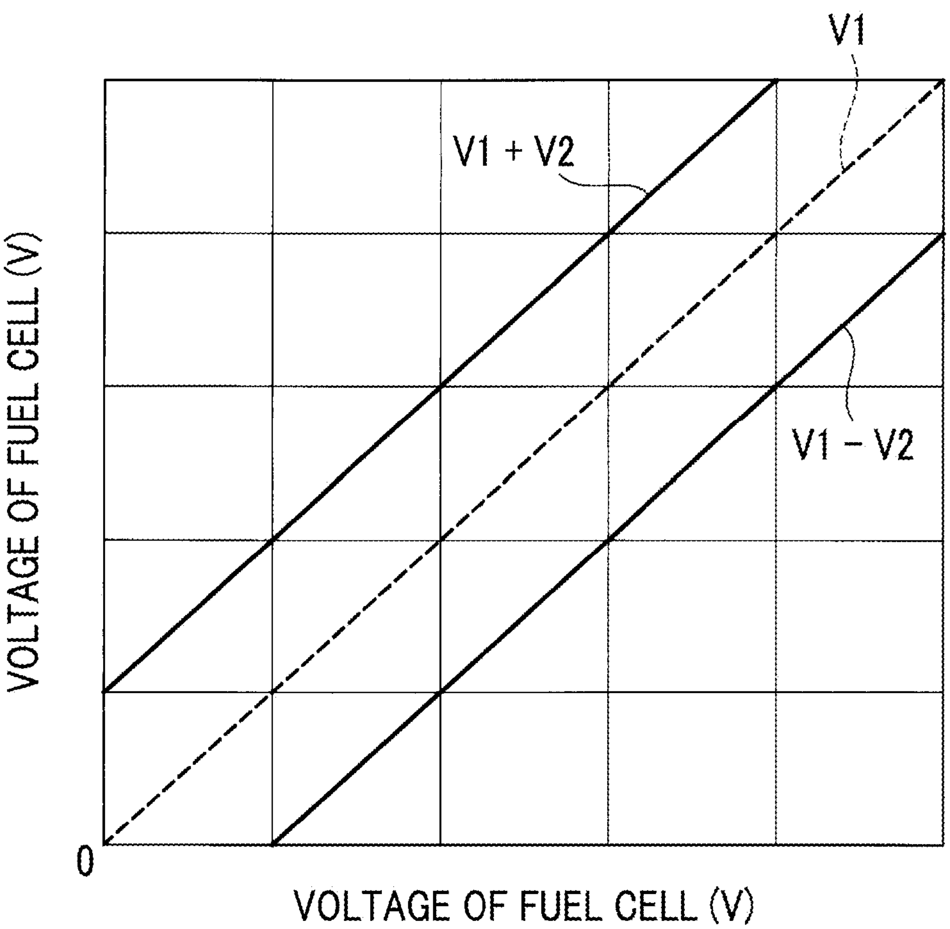
FIG. 9 is a graph illustrating a relationship between a voltage of a fuel cell and an allowable potential difference in some embodiments of the present disclosure.

FIG. 9 is a graph illustrating a relationship between a voltage of a fuel cell and an allowable potential difference in some embodiments of the present disclosure.

In FIG. 9, a vertical axis represents the voltage (potential difference between the negative electrode and the positive electrode) of the fuel cell group 10*f*, and a horizontal axis represents the voltage (potential difference between the negative electrode and the positive electrode) of the fuel cell group 10*a*. A broken line indicates a state where there is no potential difference between the intermediate points 13*a* and 13*f*, and a solid line indicates an upper limit value and a lower limit value of a range of the potential difference defined when the current of the DC-DC converter 20 is controlled.

As illustrated in FIG. 9, when the current of the DC-DC converter 20 is controlled, the range of the potential difference defined is set to be a predetermined value (V2) to be increased or decreased with a state where there is no potential difference between the intermediate points 13*a* and 13*f* (V1) as a center to set the control range. In a case of the upper limit value, the upper limit value is a value (V1+V2) obtained by increasing the value (V1) in which the potential difference is zero by a predetermined value (V2), and in a case of the lower limit value, the lower limit value is a value (V1−V2) obtained by decreasing the value (V1) in which the potential difference is zero by a predetermined value (V2). The controller 50 controls the current of the DC-DC converter 20 such that the potential difference between the intermediate points 13*a* and 13*f* is within a range of a predetermined potential difference, that is, the potential difference is equal to or greater than the lower limit value and equal to or smaller than the upper limit value. The range of the potential difference can be optionally determined in accordance with the state of the electric circuit system 1. For example, the predetermined value (V2) to be increased or decreased may be changed according to the voltage of each fuel cell group 10.

In this way, the current control unit 54 performs control such that the potential difference between the intermediate points 13*a* and 13*f* is within the range of the potential difference defined when the current of the DC-DC converter 20 is controlled. At this time, the current control unit 54 may measure or detect the potential difference between the intermediate points 13*a* and 13*f* using any of the above-described embodiments, or may use another method. The value of the current (current of the DC-DC converters 20*a* and 20*f*) of the fuel cell groups 10*a* and 10*f* controlled by the current control unit 54 is obtained from the relationship between the current and the voltage of each of the fuel cell groups 10 on the basis of the potential difference between the obtained intermediate points 13*a* and 13*f*.

Figure 10:
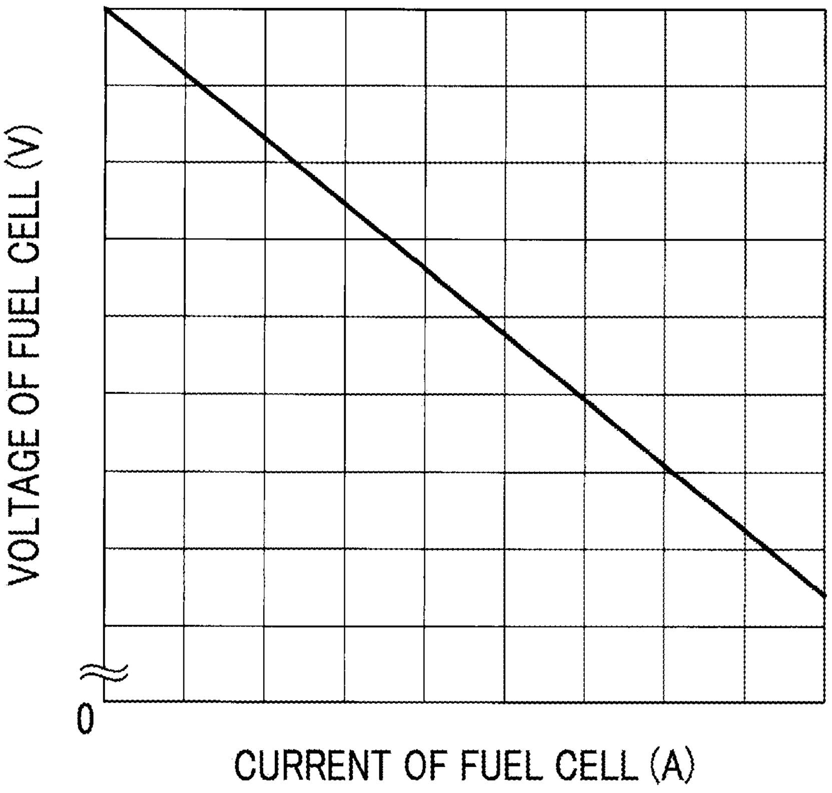
FIG. 10 is a diagram illustrating a relationship between a current and a voltage of a fuel cell in some embodiments of the present disclosure.

FIG. 10 is a diagram illustrating a relationship between a current and a voltage of a fuel cell in some embodiments of the present disclosure.

In FIG. 10, a vertical axis represents the voltage of the fuel cell group 10, a horizontal axis represents the current of the fuel cell group 10, and a solid line represents the relationship between the current and the voltage of the fuel cell. The relationship of the solid lines is merely an example, and is not necessarily limited to a linear relationship depending on the characteristics of the electric circuit.

As illustrated in FIG. 10, a relationship between the current and the voltage of the fuel cell group 10 shows a right shoulder-down graph in which the voltage value decreases when the current value increases. The current control unit 54 obtains a current value corresponding to a voltage value such that a potential difference does not occur between the intermediate points 13*a* and 13*f*, from the relationship between the current and the voltage obtained for each of the fuel cell groups 10. The current control unit 54 controls the current (load) to have a required current value.

Figure 11:
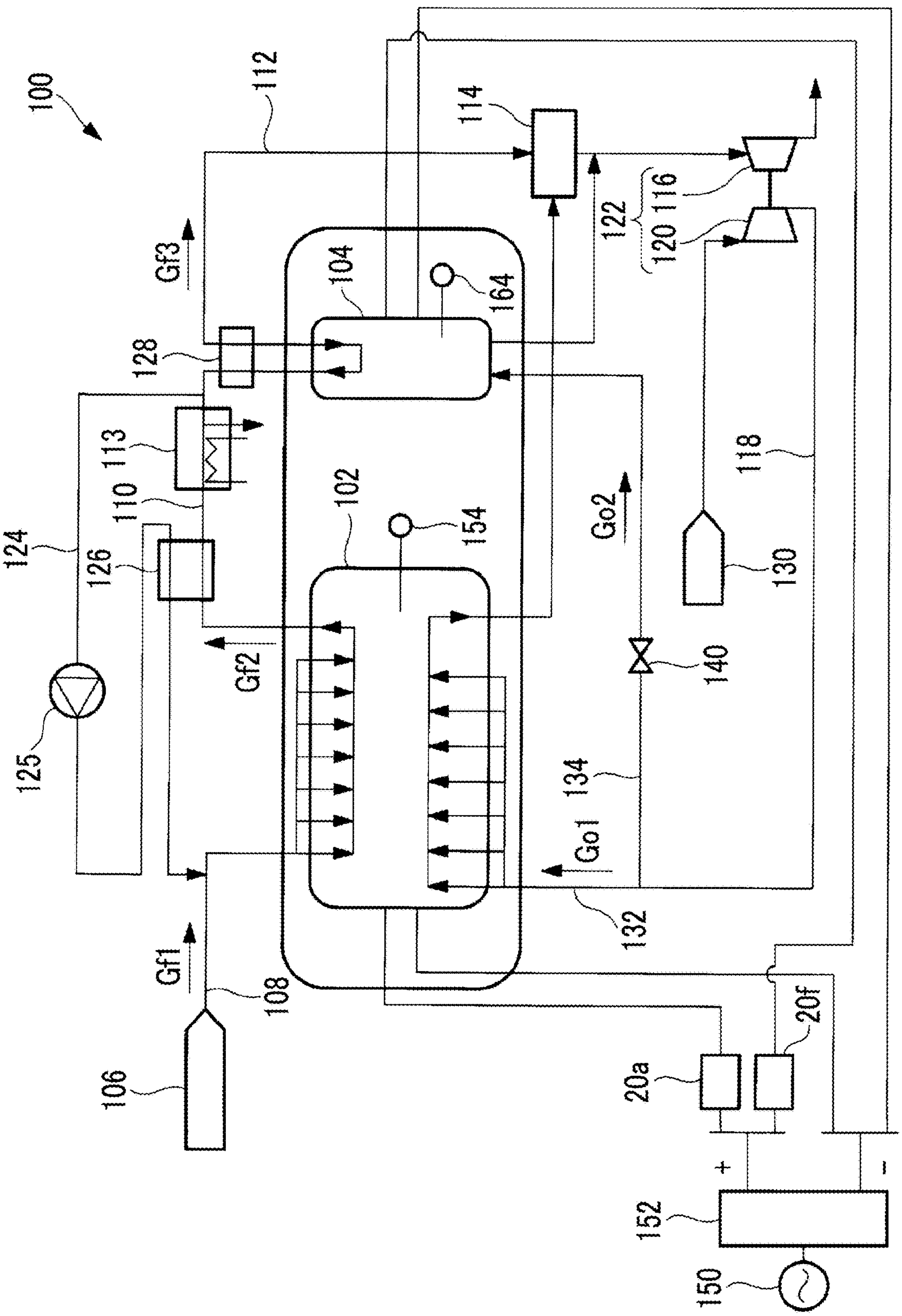
FIG. 11 is a diagram illustrating a fuel cell power generation system including an electric circuit system in some embodiments of the present disclosure.

FIG. 11 is a diagram illustrating a fuel cell power generation system including an electric circuit system according to some embodiments of the present disclosure.

As illustrated in FIG. 11, a fuel cell power generation system 100 includes a first fuel cell 102 and a second fuel cell 104. The first fuel cell 102 and the second fuel cell 104 are, for example, solid oxide fuel cell (SOFC), and generate power by means of an electrochemical reaction using a fuel and an oxidizer (oxidizing gas). The fuel is, for example, methane gas (natural gas) or propane gas, and the oxidizer is, for example, air. The first fuel cell 102 on a fuel flow upstream side (topping) corresponds to the fuel cell group 10*a* in FIG. 1, and the second fuel cell 104 on a fuel flow downstream side (bottoming) corresponds to the fuel cell group 10*f* in FIG. 1, respectively.

The first fuel cell 102 and the second fuel cell 104 include an inverter 152 for converting the generated DC power into a corresponding AC power of a power system 150. The temperature (power generation chamber temperature) of the first fuel cell 102 is monitored by a first temperature sensor 154. The detected value of the first temperature sensor 154 can be controlled to become a predetermined temperature by adjusting the current amount of the DC-DC converter 20*a*.

The current amount of the DC-DC converter 20*f* is set to an appropriate value according to the amount of a second fuel gas Gf2 exhausted from the first fuel cell 102. The temperature (power generation chamber temperature) of the second fuel cell 104 is monitored by a second temperature sensor 164. The detection value of the second temperature sensor 164 can be controlled to reach the predetermined temperature by controlling the flow rate of a second oxidizing gas Go2.

The fuel gas (first fuel gas Gf1) is supplied from a fuel gas supply source 106 to the first fuel cell 102 via a first fuel gas supply line 108. The first fuel cell 102 includes a plurality of battery cells (not illustrated), and the first fuel gas supply line 108 branches to each battery cell to supply the fuel gas in parallel.

The fuel gas (second fuel gas Gf2) exhausted from each of the battery cells of the first fuel cell 102 is supplied to the second fuel cell 104 via a second fuel gas supply line 110. The second fuel cell 104 includes at least one battery cell (not shown).

The fuel gas (third fuel gas Gf3) exhausted from the second fuel cell 104 is exhausted via a fuel gas exhaust line 112. A combustor 114 for combusting the fuel gas and a turbine 116 that can be driven by the combustion gas generated by the combustor 114 are installed on the fuel gas exhaust line 112. The combustor 114 may be a catalytic combustor. The turbine 116 is connected to a compressor 120 provided on an oxidizing gas supply line 118 as described later, and the turbine 116 constitutes a turbocharger 122 together with the compressor 120.

A moisture recovery device 113 may be installed on the second fuel gas supply line 110, The moisture recovery device 113 is a device for collecting the moisture contained in the fuel gas (second fuel gas Gf2) exhausted from the first fuel cell 102, and is configured, for example, as a condenser capable of condensing and collecting the moisture contained in the fuel gas (second fuel gas Gf2) by exchanging heat with an external cooling medium, the fuel gas (second fuel gas Gf2) on the second fuel gas supply line 110. By reducing the moisture contained in the fuel gas (second fuel gas Gf2) supplied to the second fuel cell 104, the calorific value of the fuel gas supplied to the second fuel cell 104 can be improved, and the power generation output of the second fuel cell 104 can be improved.

A recirculation line 124 is branched from the downstream side of the moisture recovery device 113 in the second fuel gas supply line 110. A blower 125 is installed on the recirculation line 124. By driving the blower 125, a part of the fuel gas (second fuel gas Gf2) flowing through the second fuel gas supply line 110 is configured to be recirculated to an inlet side of the first fuel cell 102. A first regenerative heat exchanger 126 is installed on the recirculation line 124. The fuel gas passing through the recirculation line 124 is configured to be capable of being heated by exchanging heat with the fuel gas passing through the second fuel gas supply line 110.

A second regenerative heat exchanger 128 is installed on an upstream side of the combustor 114 in the fuel gas exhaust line 112. The second regenerative heat exchanger 128 is configured to be able to raise a temperature of the fuel gas (third fuel gas Gf3) exhausted from the second fuel cell 104 by exchanging the heat with the fuel gas (second fuel gas Gf2) flowing through the second fuel gas supply line 110. By raising a temperature of the fuel gas supplied to the combustor 114, a combustion temperature of the combustor 114 can be increased.

The oxidizing gas is supplied from an oxidizing gas supply source 130 to the first fuel cell 102 and the second fuel cell 104 via the oxidizing gas supply line 118. The compressor 120 for compressing and supplying the oxidizing gas is disposed on the oxidizing gas supply line 118, and the compressor 120 constitutes the turbocharger 122 together with the turbine 116.

The oxidizing gas supply line 118 is branched to a first oxidizing gas supply line 132 and a second oxidizing gas supply line 134 on the downstream side of the compressor 120. The first oxidizing gas supply line 132 is connected to the first fuel cell 102 to supply an oxidizing gas (first oxidizing gas Go1), and the second oxidizing gas supply line 134 is connected to the second fuel cell 104 to supply an oxidizing gas (second oxidizing gas Go2). The first fuel cell 102 and the second fuel cell 104 are connected in parallel to the oxidizing gas supply source 130.

At least one of the first oxidizing gas supply line 132 and the second oxidizing gas supply line 134 is provided with an adjustment valve 140 for adjusting the amount of the oxidizing gas supplied to the second fuel cell 104. In the example of FIG. 11, the adjustment valve 140 is provided on the second oxidizing gas supply line 134 connected to the second fuel cell 104. By adjusting an opening degree of the adjustment valve 140, the amount of oxidizing gas (second oxidizing gas Go2) supplied to the second fuel cell 104 can be adjusted.

Although a case where the electric path 10 in the electric circuit system 1 of the present disclosure is the fuel cell group 10 has been described in detail, the electric path 10 may be a storage battery. The electric path 10 may be an electrolytic device. In these cases, the same treatment as in the case where the electric path 10 is the fuel cell group 10 can be performed.

Appendix

The electric circuit system, the electric circuit system controller, the electric circuit system control method, and the electric circuit system control program according to the embodiment described above are understood as follows, for example.

An electric circuit system according to a first aspect of the present disclosure includes: a plurality of electric paths (10) in which a plurality of potential difference generating units (11) are connected in series, and one pole serves as a common electrode; an earth fault detection circuit (40) that is provided between an intermediate potential portion (13) of each of the electric paths and an earth, and that is used to detect an earth fault of each of the electric paths; and a controller (50) that detects the earth fault of each of the electric paths in comparison between a measured value measured by each of the earth fault detection circuits and a threshold for determining an earth fault, in which the controller includes a potential difference acquiring unit (51) that acquires a potential difference of the intermediate potential portions of the plurality of electric paths, and a threshold setting unit (52) for setting the threshold on the basis of the potential difference acquired by the potential difference acquiring unit.

The electric circuit system includes the earth fault detection circuit that is provided between the intermediate potential portion of each of the electric paths and the earth, and that is used to detect the earth fault of each of the electric paths; and the controller that detects the earth fault of each of the electric paths by comparing each of the measured values measured by the earth fault detection circuit with the threshold for determining the earth fault, in which the controller includes the potential difference acquiring unit that acquires the potential difference of the intermediate potential portions of the plurality of electric paths, and the threshold setting unit for setting the threshold on the basis of the potential difference acquired by the potential difference acquiring unit. Accordingly, the earth fault can be appropriately detected according to an operation state of the electric path, safety of an electric circuit can be improved, and a facility can be protected. In addition, it is possible to suppress erroneous detection of the earth fault.

An electric circuit system according to a second aspect of the present disclosure includes: a plurality of electric paths in which a plurality of potential difference generating units are connected in series, and one pole serves as a common electrode; an earth fault detection circuit that is provided between an intermediate potential portion of each of the electric paths and an earth, and that is used to detect an earth fault of each of the electric paths; and a controller that detects the earth fault of each of the electric paths in comparison between a measured value measured by each of the earth fault detection circuits and a threshold for determining an earth fault, in which the controller includes a potential difference acquiring unit that acquires a potential difference of the intermediate potential portions of the plurality of electric paths, and a current control unit (54) that controls a current flowing through the plurality of electric paths such that the potential difference acquired by the potential difference acquiring unit is set within a predetermined potential difference range.

The controller includes the potential difference acquiring unit that acquires the potential difference of the intermediate potential portions of the plurality of electric paths, and the current control unit that controls the current flowing through the plurality of electric paths such that the potential difference acquired by the potential difference acquiring unit is within the predetermined potential difference range. Accordingly, no current flows through the earth fault detection circuit, and it is possible to suppress erroneous detection of the earth fault. In addition, the earth fault can be appropriately detected to improve the safety of the electric circuit and protect the facility.

The electric circuit system according to a third aspect of the present disclosure may further include, in the first or second aspect, an intermediate point voltage sensor (60) that measures the potential difference of each of the intermediate potential portions of the plurality of electric paths, in which the potential difference acquiring unit may acquire the potential difference from the intermediate point voltage sensor.

The electric circuit system includes an intermediate point voltage sensor that measures the potential difference of each of the intermediate potential portions of the plurality of electric paths, in which the potential difference acquiring unit acquires the potential difference from the intermediate point voltage sensor. Accordingly, the detection of the earth fault can be determined on the basis of the potential difference which is appropriately detected. In addition, it is possible to suppress erroneous detection of the earth fault, to improve the safety of the electric circuit, and to protect the facility.

In the electric circuit system according to a fourth aspect of the present disclosure, in the first or second aspect, the potential difference acquiring unit may acquire the potential difference by estimating a potential of each of the intermediate potential portions based on a voltage on a side of a pole opposite to the common electrode of the plurality of electric paths.

The potential difference acquiring unit acquires the potential difference by estimating the potential of each of the intermediate potential portions based on a voltage on a side of a pole opposite to the common electrode of the plurality of electric paths. Accordingly, the potential can be appropriately detected from each of the electric paths, and the detection of the earth fault can be determined on the basis of the potential difference. In addition, it is possible to suppress erroneous detection of the earth fault, to improve the safety of the electric circuit, and to protect the facility.

The electric circuit system according to a fifth aspect of the present disclosure may further include, in the first or second aspect, a current sensor (80) that detects a current flowing through each of the electric paths, in which the potential difference acquiring unit acquires the potential difference by using a current value acquired from the current sensor.

The electric circuit system includes the current sensor that detects the current flowing through each of the electric paths, in which the potential difference acquiring unit acquires the potential difference by using the current value acquired from the current sensor. Accordingly, the potential difference can be appropriately detected from each of the electric paths, and the detection of the earth fault can be determined on the basis of the potential difference. In addition, it is possible to suppress erroneous detection of the earth fault, to improve the safety of the electric circuit, and to protect the facility.

In the electric circuit system according to a sixth aspect of the present disclosure, in any one of the first to fifth aspects, the other pole of each of the electric paths may be connected via a voltage converter.

In the electric circuit system according to a seventh aspect of the present disclosure, in any one of the first to sixth aspects, the earth fault detection circuit may include a resistor and a voltage sensor that measures a voltage of both ends of the resistor, and the controller may include a determination unit (53) that determines, in a case where the voltage measured by the voltage sensor exceeds the threshold set by the threshold setting unit, the earth fault.

The earth fault detection circuit includes the resistor and the voltage sensor that measures the voltage of the both ends of the resistor, and the controller determines, in a case where the voltage measured by the voltage sensor exceeds the threshold set by the threshold setting unit, the earth fault. Accordingly, the earth fault can be appropriately determined, and the erroneous detection of the earth fault can be suppressed.

In the electric circuit system according to an eighth aspect of the present disclosure, in any one of the first to seventh aspects, the threshold may be a value obtained by adding a predetermined value to the potential difference acquired by the potential difference acquiring unit.

The threshold is the value obtained by adding the predetermined value to the potential difference acquired by the potential difference acquiring unit. Accordingly, it is possible to have a tolerance in determining the earth fault and to suppress erroneous detection of the earth fault.

In the electric circuit system according to a ninth aspect of the present disclosure, in any of the first to eighth aspects, the electric path may be a power generation device.

In the electric circuit system according to a tenth aspect of the present disclosure, in the ninth aspect, the power generation device may be a fuel cell.

In the electric circuit system according to an eleventh aspect of the present disclosure, in any of the first to eighth aspects, the electric path may be a storage battery.

In the electric circuit system according to a twelfth aspect of the present disclosure, in any one of the first to eighth aspects, the electric path may be an electrolytic device.

An electric circuit system controller according to a thirteenth aspect of the present disclosure being a controller for an electric circuit system including a plurality of electric paths in which a plurality of potential difference generating units are connected in series, and one pole serves as a common electrode, and an earth fault detection circuit that is provided between an intermediate potential portion of each of the electric paths and an earth, and that is used to detect an earth fault of each of the electric paths, in which the controller detects the earth fault of each of the electric paths in comparison between a measured value measured by each of the earth fault detection circuits and a threshold for determining an earth fault, the controller including: a potential difference acquiring unit that acquires a potential difference of the intermediate potential portions of the plurality of electric paths; and a threshold setting unit for setting the threshold on the basis of the potential difference acquired by the potential difference acquiring unit.

An electric circuit system control method according to a fourteenth aspect of the present disclosure being a control method for an electric circuit system including a plurality of electric paths in which a plurality of potential difference generating units are connected in series, and one pole serves as a common electrode, an earth fault detection circuit that is provided between an intermediate potential portion of each of the electric paths and an earth, and that is used to detect an earth fault of each of the electric paths, and a controller, in which the controller detects the earth fault of each of the electric paths in comparison between a measured value measured by each of the earth fault detection circuits and a threshold for determining an earth fault, the control method including: a potential difference acquisition step of acquiring a potential difference of the intermediate potential portions of the plurality of electric paths; and a threshold setting step of setting the threshold on the basis of the potential difference acquired by the potential difference acquiring step.

An electric circuit system control program according to a fifteenth aspect of the present disclosure being a control program for an electric circuit system including a plurality of electric paths in which a plurality of potential difference generating units are connected in series, and one pole serves as a common electrode, an earth fault detection circuit that is provided between an intermediate potential portion of each of the electric paths and an earth, and that is used to detect an earth fault of each of the electric paths, and a controller, in which the controller detects the earth fault of each of the electric paths in comparison between a measured value measured by each of the earth fault detection circuits and a threshold for determining an earth fault, the control program executed by the controller, including: a potential difference acquisition step of acquiring a potential difference of the intermediate potential portions of the plurality of electric paths; and a threshold setting step of setting the threshold on the basis of the potential difference acquired by the potential difference acquiring step.

REFERENCE SIGNS LIST

1: electric circuit system
10: fuel cell group (electric path)
11: fuel cell (potential difference generating unit)
13: intermediate point
20: DC-DC converter (voltage converter)
30: inverter
40: earth fault detection circuit
41: voltage sensor
42: resistor
43: circuit breaker
50: controller
51: potential difference acquiring unit
52: threshold setting unit
53: determination unit
54: current control unit
60: intermediate point voltage sensor
70: DC-DC converter voltage sensor
80: current sensor
100: fuel cell power generation system
102: first fuel cell
104: second fuel cell
106: fuel gas supply source
108: first fuel gas supply line
110: second fuel gas supply line
112: fuel gas exhaust line
113: moisture recovery device
114: combustor
116: turbine
118: oxidizing gas supply line

120: compressor
122: turbocharger
124: recirculation line
125: blower
126: first regenerative heat exchanger
128: second regenerative heat exchanger
130: oxidizing gas supply source
132: first oxidizing gas supply line
134: second oxidizing gas supply line
140: adjustment valve
150: power system
152: inverter
154: first temperature sensor
164: second temperature sensor
1100: CPU
1200: secondary storage
1300: main memory
1400: hard disk drive
1500: communication unit
1800: bus

The invention claimed is:

1. An electric circuit system comprising:

a plurality of electric paths in which a plurality of potential difference generating units are connected in series, and one pole serves as a common electrode;

an earth fault detection circuit that is provided between an intermediate potential portion of each of the electric paths and an earth, and that is used to detect an earth fault of each of the electric paths; and a controller that detects the earth fault of each of the electric paths in comparison between a measured value measured by each of the earth fault detection circuits and a threshold for determining an earth fault, wherein the controller includes a potential difference acquiring unit that acquires a potential difference of the intermediate potential portions of the plurality of electric paths, and a threshold setting unit for setting the threshold on the basis of the potential difference acquired by the potential difference acquiring unit.

2. The electric circuit system according to claim 1, further comprising:

an intermediate point voltage sensor that measures the potential difference of each of the intermediate potential portions of the plurality of electric paths, wherein the potential difference acquiring unit acquires the potential difference from the intermediate point voltage sensor.

3. The electric circuit system according to claim 1, wherein the potential difference acquiring unit acquires the potential difference by estimating a potential of each of the intermediate potential portions based on a voltage on a side of a pole opposite to the common electrode of the plurality of electric paths.

4. The electric circuit system according to claim 1, further comprising:

a current sensor that detects a current flowing through each of the electric paths, wherein the potential difference acquiring unit acquires the potential difference by using a current value acquired from the current sensor.

5. The electric circuit system according to claim 1, wherein the other pole of each of the electric paths is connected via a voltage converter.

6. The electric circuit system according to claim 1, wherein the earth fault detection circuit includes a resistor and a voltage sensor that measures a voltage of both ends of the resistor, and the controller includes a determination unit that determines, in a case where the voltage measured by the voltage sensor exceeds the threshold set by the threshold setting unit, the earth fault.

7. The electric circuit system according to claim 6, wherein the threshold is a value obtained by adding a predetermined value to the potential difference acquired by the potential difference acquiring unit.

8. The electric circuit system according to claim 1, wherein the electric path is a power generation device.

9. The electric circuit system according to claim 8, wherein the power generation device is a fuel cell.

10. The electric circuit system according to claim 1, wherein the electric path is a storage battery.

11. The electric circuit system according to claim 1, wherein the electric path is an electrolytic device.

12. An electric circuit system comprising:

a plurality of electric paths in which a plurality of potential difference generating units are connected in series, and one pole serves as a common electrode;

an earth fault detection circuit that is provided between an intermediate potential portion of each of the electric paths and an earth, and that is used to detect an earth fault of each of the electric paths; and a controller that detects the earth fault of each of the electric paths in comparison between a measured value measured by each of the earth fault detection circuits and a threshold for determining an earth fault, wherein the controller includes a potential difference acquiring unit that acquires a potential difference of the intermediate potential portions of the plurality of electric paths, and a current control unit that controls a current flowing through the plurality of electric paths such that the potential difference acquired by the potential difference acquiring unit is set within a predetermined potential difference range.

13. An electric circuit system controller being a controller for an electric circuit system including a plurality of electric paths in which a plurality of potential difference generating units are connected in series, and one pole serves as a common electrode, and an earth fault detection circuit that is provided between an intermediate potential portion of each of the electric paths and an earth, and that is used to detect an earth fault of each of the electric paths, in which the controller detects the earth fault of each of the electric paths in comparison between a measured value measured by each of the earth fault detection circuits and a threshold for determining an earth fault, the controller comprising:

a potential difference acquiring unit that acquires a potential difference of the intermediate potential portions of the plurality of electric paths; and a threshold setting unit for setting the threshold on the basis of the potential difference acquired by the potential difference acquiring unit.

14. An electric circuit system control method being a control method for an electric circuit system including a plurality of electric paths in which a plurality of potential difference generating units are connected in series, and one pole serves as a common electrode, an earth fault detection circuit that is provided between an intermediate potential portion of each of the electric paths and an earth, and that is used to detect an earth fault of each of the electric paths, and a controller, in which the controller detects the earth fault of each of the electric paths in comparison between a measured value measured by each of the earth fault detection circuits and a threshold for determining an earth fault, the control method comprising:

a potential difference acquisition step of acquiring a potential difference of the intermediate potential portions of the plurality of electric paths; and a threshold setting step of setting the threshold on the basis of the potential difference acquired by the potential difference acquisition step.

15. An electric circuit system control program being a control program for an electric circuit system including a plurality of electric paths in which a plurality of potential difference generating units are connected in series, and one pole serves as a common electrode, an earth fault detection circuit that is provided between an intermediate potential portion of each of the electric paths and an earth, and that is used to detect an earth fault of each of the electric paths, and a controller, in which the controller detects the earth fault of each of the electric paths in comparison between a measured value measured by each of the earth fault detection circuits and a threshold for determining an earth fault, the control program executed by the controller, comprising:

a potential difference acquisition step of acquiring a potential difference of the intermediate potential portions of the plurality of electric paths; and a threshold setting step of setting the threshold on the basis of the potential difference acquired by the potential difference acquisition step.

* * * * *